(12) United States Patent  (10) Patent No.: US 7,773,009 B2
Rychen  (45) Date of Patent: Aug. 10, 2010

(54) HIGH RESOLUTION DIGITAL ANALOG CONVERSION CIRCUIT

(75) Inventor: Jorg Rychen, Zurich (CH)

(73) Assignee: Specs Zurich GmbH, Zurich (CH)

( * ) Notice: Subject to any disclaimer, the term of this patent is extended or adjusted under 35 U.S.C. 154(b) by 0 days.

(21) Appl. No.: 12/107,935

(22) Filed: Apr. 23, 2008

(65) Prior Publication Data

US 2008/0266153 A1  Oct. 30, 2008

(30) Foreign Application Priority Data

Apr. 24, 2007 (EP) .................................. 07008269

(51) Int. Cl.
*H03M 1/10* (2006.01)
(52) U.S. Cl. ........................ 341/120; 341/118; 341/144
(58) Field of Classification Search ................. 341/118, 341/120, 144
See application file for complete search history.

(56) References Cited

U.S. PATENT DOCUMENTS

| 5,034,744 | A | | 7/1991 | Obinata | |
|---|---|---|---|---|---|
| 5,061,925 | A | * | 10/1991 | Sooch et al. ................. | 341/120 |
| 5,781,142 | A | | 7/1998 | Onodera et al. | |
| 5,955,979 | A | | 9/1999 | Knudsen | |
| 6,825,670 | B2 | | 11/2004 | Bussinger | |
| 6,856,269 | B1 | | 2/2005 | Shih | |
| 6,984,979 | B1 | | 1/2006 | Edel | |
| 7,355,536 | B2 | * | 4/2008 | Dempsey et al. ............ | 341/120 |
| 7,378,998 | B2 | * | 5/2008 | Rudberg et al. ............. | 341/118 |
| 2008/0197839 | A1 | | 8/2008 | Machul et al. | |
| 2008/0238406 | A1 | | 10/2008 | Banhegyesi | |
| 2008/0282808 | A1 | | 11/2008 | Trieu et al. | |

OTHER PUBLICATIONS

Wescott, T., "Sigma-delta techniques extend DCA resolution," Wescott Design Services.
Williams, J.: 20-bit DAC demonstrates the art of digitizing 1 ppm, Part 1, EDN, pp. 95-106 (Apr. 12, 2001).
European Search Report in related application No. EP 07008269.8 dated Sep. 26, 2007.
European Search Report from the European Patent Office for Application No. 07008269.8, dated Oct. 4, 2007.
Wescott, T., "Sigma-delta techniques extend DAC resolution."
Williams et al., "20-bit DAC demonstrates the art of digitizing 1 ppm Part 1: exploring design options," *EDN Magazine*, pp. 95-106 (2001).

* cited by examiner

*Primary Examiner*—Khai M Nguyen
(74) *Attorney, Agent, or Firm*—Cooper & Dunham LLP

(57) ABSTRACT

To increase the accuracy and resolution of an m bit digital analog converter, n bit input values with n>m are fed to a control circuit and converted to a series of control values for the digital analog converter using dithering techniques. When the series of control values straddles a major transition where a large number of bits are switched between 1 and 0, a corrected series of control values is retrieved from a calibration table. The corrected series takes into account the glitch effects observed at the output of digital analog converter at a major transition.

7 Claims, 1 Drawing Sheet

HIGH RESOLUTION DIGITAL ANALOG CONVERSION CIRCUIT

CROSS REFERENCE RELATED APPLICATIONS

This application claims the priority of European patent application 07008269.8, filed Apr. 24, 2007, the disclosure of which is incorporated herein by reference its entirety.

BACKGROUND OF THE INVENTION

The invention relates to a high resolution digital analog conversion circuit.

Digital to analog converters (DAC) available today have usually up to 16 bit resolution. Converters with higher resolution tend to be expensive and/or are very slow.

In some applications converters having a high precision and monotonicity are required. For example, nanopositioning and servo control applications require a high resolution DAC, with particularly high monotonicity. Typical requirements are for a DAC with a resolution and monotonicity of at least 20 bits and an analog bandwidth of at least 5 kHz.

One way to increase the resolution is to use 16 bit conversion and to switch its value fed to the DAC between two adjacent 16 bit values, thereby obtaining pulse width modulation with the least significant bit. This allows to achieve a resolution of n bits with a DAC having a resolution of m<n bits. The n bit input value to the digital analog conversion circuit is fed to a control circuit, which converts the input value to a series of different m bit control values and feeds the control values to the DAC. The DAC generates a time-dependent raw voltage whose average is equal to the desired output voltage.

The noise generated by the modulation can be suppressed by means of a low-pass filter. In theory the update frequency of a 16 bit converter has to be more than 16 times higher than the cut-off frequency to achieve a resolution off 20 bit.

The sigma delta architecture is more advanced than the simple pulse width modulation technique since it will distribute the modulation noise to a broad high frequency range.

These methods suffer from glitch effects that are generated when a DAC switches through a major bit transition. For example, when the input value to the DAC changes from 0111111111111111 to 100000000000000, 15 current sources within the DAC have to be switched off and one has to be switched on. The timing of this switching process is never perfect and therefore an intermediary pulse is generated, a so-called "glitch". This type of glitch does not have equal magnitude when incrementing and decrementing the input value. Hence, using pulse width modulation over a major bit transition generates an undesired DC error in the result.

One way to overcome this is to use two sigma-delta modulated DACs fed with input values of opposite sign and to form the difference voltage between their outputs. Even though this yields better results, two DACs of a specific design will exhibit slightly different glitch values, and a small DC offset will remain.

BRIEF SUMMARY OF THE INVENTION

Hence, the object of the present invention is to provide a digital analog conversion circuit of high resolution and high monotonicity.

This and further objects are a achieved by a digital analog conversion circuit converting an input value of n bits to an output voltage comprising a digital analog converter having a resolution of m<n bits and converting a control value of m bits to a raw voltage, a control circuit converting a said input value to a series of different control values and thereby generating a raw voltage whose average is equal to said output voltage, wherein said control circuit comprises a calibration table, wherein said calibration table attributes, to a subset of all possible input values, series of control values.

Hence, the problem is solved by providing the control circuit with a calibration table. This table attributes series of control values (i.e. values to be fed to the DAC) to a at least a subset of the possible input values. This scheme allows to use non-linear interpolation when dithering takes place over a major bit transition.

The digital analog conversion circuit is 25 operated by first checking if a received n bit input value belongs to the subgroup that requires a consultation of the calibration table. If yes, the calibration table is consulted for generating the series of m bit control values to be fed to the DAC.

Advantageously, the subset of input values for which the control value series is obtained through the calibration table is the set of all input values that require dithering over a major transition. In other words, the subset is defined by those input values whose series of control values comprises subsequent binary values whose k least significant bits change between ... 111 and ... 000 with k being an integer larger than 1. Typically, k is larger than 7.

In another aspect of the invention, the object is achieved by a method for generating an analog output voltage from a digital input value using the digital analog conversion circuit of any of the above type comprising the steps of checking if a received input value belongs to said subset of input values, and, if yes consulting said calibration table for generating the series of control values attributed to said received input value.

The circuit and method of the present invention are particularly suited for nanopositioning devices where a high resolution and monotonicity is required.

BRIEF DESCRIPTION OF THE DRAWINGS

The invention will be better understood and objects other than those set forth above will become apparent when consideration is given to the following detailed description thereof. Such description makes reference to the annexed drawings, wherein.

DETAILED DESCRIPTION OF THE INVENTION

Figure 1:
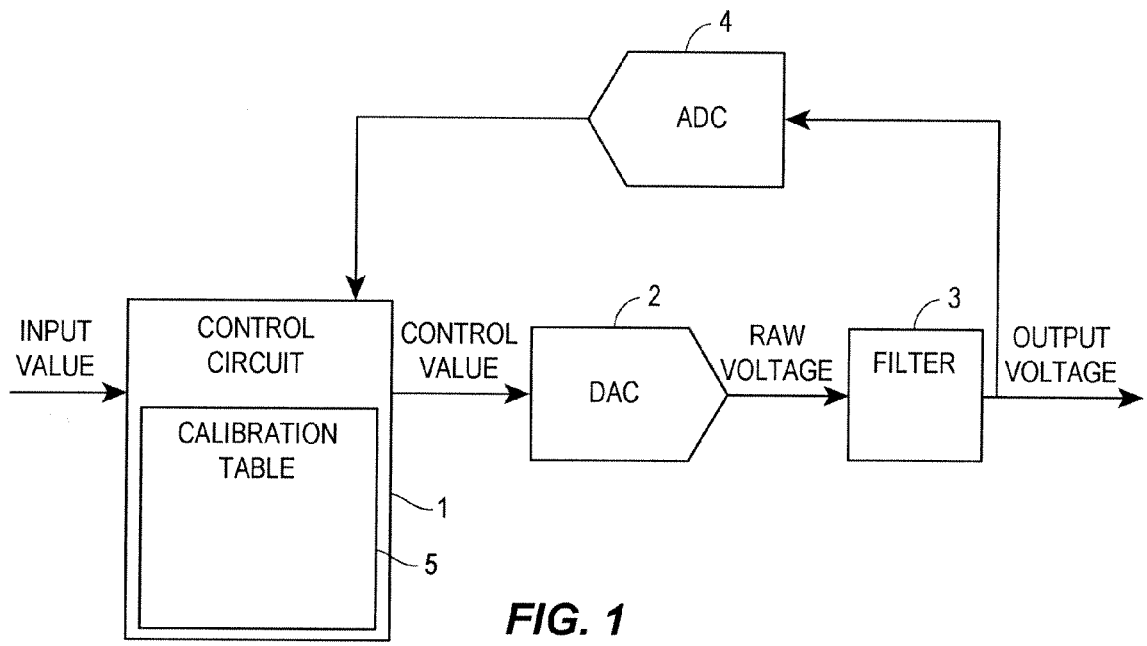
FIG. 1 a block diagram of a digital analog conversion circuit.

The digital analog conversion circuit of FIG. 1 comprises a control circuit 1 with an input for receiving an n bit input value, e.g. with n=20. Control circuit 1 generates a series of m bit control values, e.g. with m=16, and feeds the same to an m bit DAC 2. For each control value, DAC 2 generates the corresponding voltage, termed "raw voltage" in the following. The raw voltage is fed to a low pass filter 3 for generating the output voltage of the digital analog conversion circuit. The digital analog conversion circuit further comprises an analog digital converter (ADC) 4 that allows to measure the output voltage and feeds it back to control circuit 1 for calibration.

Control circuit 1 may be a programmable logic circuit, such as a FPGA.

The purpose of the device of FIG. 1 is to generate an output voltage vout as a function of the input value vi, i.e.

$$vout = f(vi) \quad (1)$$

with f typically being a linear function.

Operation of the device of FIG. 1 is as follows:

When an input value vi is fed to control circuit 1, control circuit 1 first checks if the input value vi requires dithering over a major transition. For example, in the present example, input values having the format $$xxxxxxxx11111111yyyy$$

require dithering, i.e. values whose bits n−m through n−m+k−1 are 1, while x and y denote bits whose value does not matter in this context. k is an integer larger 1, e.g. k=8 in the present embodiment. (Note: In the convention used here, bit 0 is the least significant bit, while bit n−1 is the most significant bit of the input value.)

If an input value vin does not require dithering over a major transition, conventional sigma delta conversion is used. This is achieved by feeding a series of two adjacent control values to DAC 2, namely $$vc1 = vin \text{ div } 2^{(n-m)} \text{ and}$$

$$vc2 = vin \text{ div } 2^{(n-m)} + 1, \quad (2)$$

with div denoting integer division with downward rounding. This generates a raw voltage trace uraw(t) as shown in the upper trace of FIG. 2.

The time fractions during which vc1 and vc2, respectively, are applied to DAC 2 are such that the timeweighted average avg(vc) of the control values vc is $vin/2^{(n-m)}$, with "/" denoting floating point division, i.e.

$$avg(vc) = vin/2^{(n-m)} \quad (3)$$

Typically, the series of control voltages is generated synchronously to a clock signal at a frequency fc, wherein the average avg(vc) over $2^{(n-m)}$ clock cycles fulfills condition above, and low pass filter 3 is dimensioned to filter out any noise with a frequency of $fc/2^{(n-m)}$ or higher, while it does not suppress components of lower frequency. Hence, the output voltage after filter 3 is the average avg(uraw(t)) of the raw voltage and equals the desired output voltage f(vi) of equation.

If it is found that an input value vin requires dithering over a major transition, i.e. if the k least significant bits of vc1 and vc2 as defined above are all 1 and 0, respectively, the series of control values is obtained by means of a calibration table 5 stored in control circuit 1.

Figure 3:
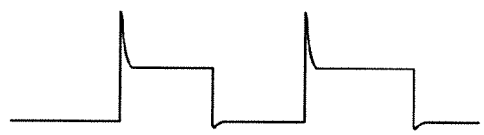

As mentioned above, when vc1 and vc2 straddle a major transition, a simple time weighted distribution of vc1 and vc2 fulfilling condition will not yield a raw voltage that averages to the desired voltage. This is illustrated in FIG. 3, which shows the raw voltage trace for control values vc1 and vc2 at a major transition. As can be seen, a strong, asymmetric transient over- or undershoot (glitch) is observed, which gives rise to a DC offset in the time averaged output voltage after filter 3.

This problem can be overcome if the series of control values fed to DAC 2 is chosen such that it compensates for the glitch. In the example illustrated in FIG. 3, this means that the series of control values vc must be such that avg(vc)<$vin/2^{(n-m)}$ in order to compensate for the net positive overshoot that is observed.

Calibration table 5 stores, for each input value in the subset of input values requiring dithering over a major transition, a suitable series of control values vc, which generate a raw voltage trace uraw(t) whose average avg(uraw(t)) is equal to the desired output voltage f(vi) of equation. It must be noted that the stored series of control voltages would not generate the desired output voltage f(vi) if the DAC 2 did not generate an overshoot/undershoot at the respective major transition. In other words, the condition equation is not fulfilled for the series stored calibration table 5.

Advantageously, the series of control values vc stored in calibration table 5 comprises values that differ by more than 1. For example, if a strong overshoot as shown in FIG. 3 occurs when switching between vc1 and vc2 as defined by equation, the series of control values can comprise additional values vc3=vc1−4, and a sequence vc1, vc3, vc2, . . . as shown in the lower trace of FIG. 2 can be used, wherein an "anti-glitch impulse" at control value vc3 is attributed to each pulse at control value vc2. Using a series of control values having values differing by more than 1 allows to compensate a large overshoot.

Calibration table 5 has to be generated in one or more calibration steps. In each step, a suitable series of control values vc is determined for a given input value in the subset mentioned above. The series of control values vc obtained in this way is stored in suitable form in calibration table 5.

Figure 2:
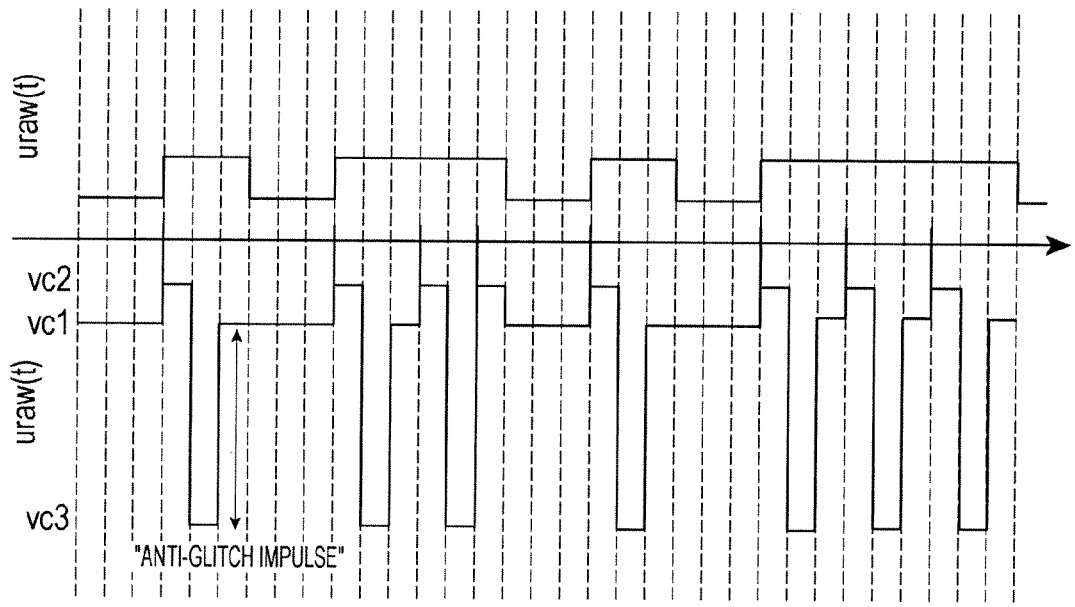
FIG. 2 a conventional raw voltage (upper trace) and higher order dithered raw voltage (lower trace) at the output of the DAC, and FIG. 3 raw voltage trace with asymmetric glitch.

During calibration, a trial series of control values straddling a major transition is generated, e.g. a series of control values vc1 and vc2 as defined in equation. The output voltage after filter 3, i.e. the averaged raw voltage, is measured by the n bit analog digital converter 4 and compared to an expected value derived from the weighted time average of the series, which allows to assess the magnitude of the overshoot/undershoot and to determine the correction required. For example, if it is found that there is a positive offset in the output voltage, individual negatively offset control voltage values vc3 can be added to the series of control values to be fed to DAC 2, as illustrated in FIG. 2. The resulting series of control values can be stored in calibration table 5, either explicitly (e.g. in the form of the control values to be fed to DAC 2 during each clock pulse), or in some compressed form (e.g. by merely indicating the magnitude of overshoot/undershoot at each major transition).

Calibration steps are performed for each of the input values in the subset. These steps can e.g. be carried out by control circuit 1 itself, or e.g. by a computer system connected to the digital analog conversion circuit.

It must be noted that each major transition may require a different compensation, and individual calibration steps are required for each of them. The most significant m−k bits of the input value can be used as an address for looking up the suitable series of control values calibration table 5.

The calibration steps can be repeated at regular intervals, e.g. once each hour, or when initializing the digital analog conversion circuit during startup. They may also be carried out only once during manufacturing of the digital analog conversion circuit, but a repeated calibration is advantageous because it can compensate for temperature drifts and aging of the circuitry.

The embodiment shown in FIG. 1 is merely one example of an implementation of the invention. It must be noted that the control circuit 1 can also be a software module in a computer, which directly drives DAC 2. Also, even though a single DAC 2 is shown, the technique of the present invention can also be used in circuits that comprise two symmetrical DACs fed with opposite control values of opposite sign.

While there are shown and described presently preferred embodiments of the invention, it is to be distinctly understood that the invention is not limited thereto but may be otherwise variously embodied and practised within the scope of the following claims.

What is claimed is:

1. A digital analog conversion circuit converting an input value of n bits to an output voltage comprising
    a digital analog converter having a resolution of m<n bits and converting a control value of m bits to a raw voltage,
    a control circuit converting a said input value to a series of different control values and thereby generating a raw voltage whose average is equal to said output voltage,
    wherein said control circuit comprises a calibration table, wherein said calibration table attributes, to a subset of all possible input values, series of control values.

2. The digital analog conversion circuit of claim 1 wherein said subset is the set of all possible input values whose series of control values comprises binary values whose k least significant bits change between . . .111 and . . .000 with k being an integer larger than 1.

3. The digital analog conversion circuit of claim 2 wherein said subset is the set of all possible input values whose series of control values comprises binary values whose k least significant bits change between . . . 111 and . . .000 with k being an integer larger than 7.

4. The digital analog conversion circuit of claim 1 wherein at least part of said series of control values derived from said calibration table comprises values differing by more than 1.

5. A method for generating an analog output voltage from a digital input value using the digital analog conversion circuit of claim 1 comprising the steps of
    checking if a received input value belongs to said subset of input values, and, if yes
    consulting said calibration table for generating the series of control values attributed to said received input value.

6. The method of claim 5 further comprising a calibration step wherein, for at least one input value in said subset, the series of control values attributed to said input value is found by feeding trial control values to said digital analog converter.

7. The method of claim 6 wherein said calibration step comprises
    generating a trial series of control values, feeding the trial series to said digital analog converter and
    measuring an average value of said raw voltage in response to said trial series for obtaining a series to be stored in said calibration table.

\* \* \* \* \*